United States Patent [19]

Terashima et al.

[11] Patent Number: 4,496,424

[45] Date of Patent: Jan. 29, 1985

[54] METHOD FOR MANUFACTURE OF III-V COMPOUND SEMICONDUCTING SINGLE CRYSTAL

[75] Inventors: Kazutaka Terashima, Ebina; Tsuguo Fukuda, Yokohama, both of Japan

[73] Assignees: Agency of Industrial Science & Technology; Ministry of International Trade & Technology, both of Tokyo, Japan

[21] Appl. No.: 455,734

[22] Filed: Jan. 5, 1983

[30] Foreign Application Priority Data

Mar. 30, 1982 [JP] Japan .................. 57-50031
Mar. 30, 1982 [JP] Japan .................. 57-50032

[51] Int. Cl.³ .................. C30B 15/20; C30B 27/02
[52] U.S. Cl. .................. 156/601; 156/607; 156/DIG. 70
[58] Field of Search .................. 156/601, 607, 616 A, 156/617 SP, DIG. 70, DIG. 89

[56] References Cited

U.S. PATENT DOCUMENTS 3,980,438  9/1976  Castonguay et al. ........... 156/601 X

FOREIGN PATENT DOCUMENTS 54-102295  8/1979  Japan ........................ 156/DIG. 89

OTHER PUBLICATIONS

AuCoin et al., Liquid Encapsulated Compounding and Czochralski Growth of Semi-insulating Gallium Arsenide, Solid State Tech., Jan. 1979, pp. 59-62, 67.

Primary Examiner—Hiram H. Bernstein
Assistant Examiner—Michael S. Gzybowski
Attorney, Agent, or Firm—Oblon, Fisher, Spivak, McClelland & Maier

[57] ABSTRACT

A III-V compound semiconducting single crystal is manufactured by a method using an encapsulant, which method comprises allowing the molten mass of a material for the crystal melted in advance under high pressure to be placed under a pressure lower than the pressure to be exerted during the work of pulling the crystal thereby causing the molten mass to generate bubbles and allowing the departing bubbles to entrain impurities from the molten mass, bringing a seed crystal into contact with the molten mass, applying a potential to the molten mass thereby determining the impurity concentration of the molten mass based on the results of the measurement and, after the impurity concentration of the molten mass determined as described above has reached a prescribed level, initiating the work of pulling the crystal from the molten mass.

3 Claims, 9 Drawing Figures

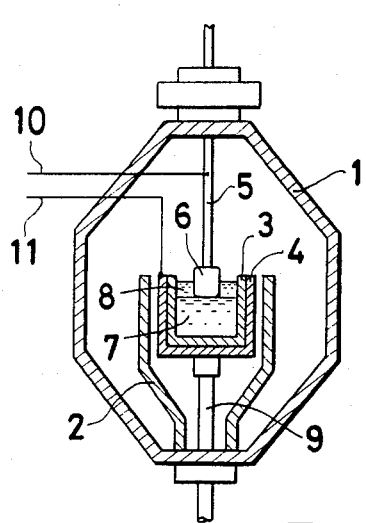
Fig_1
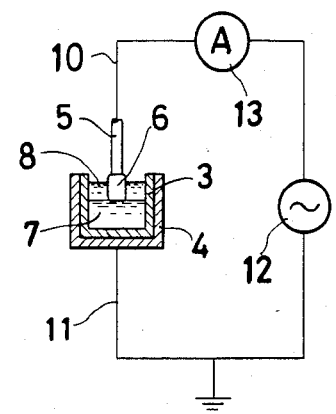
Fig_2
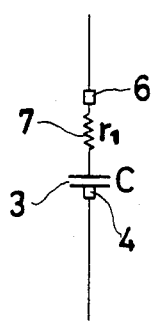
Fig_3(A)
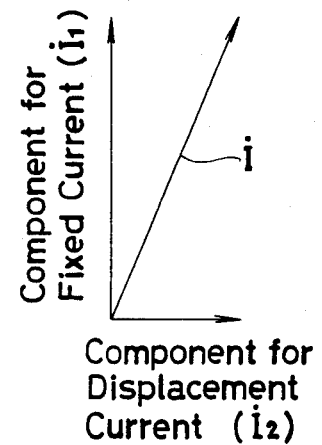
Fig_3(B)
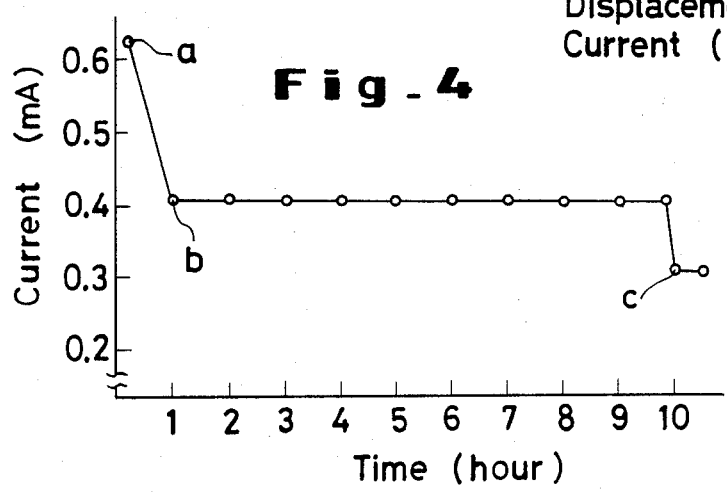
Fig_4

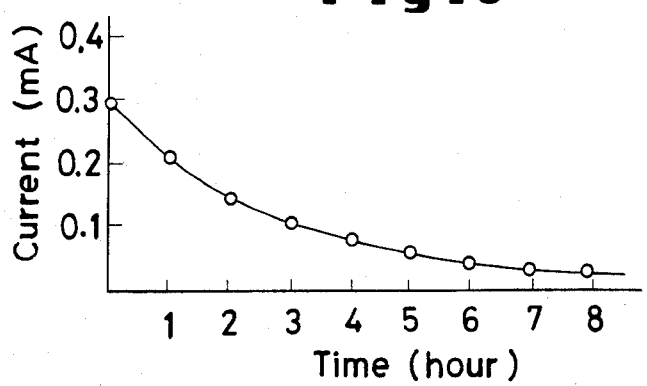
Fig_5
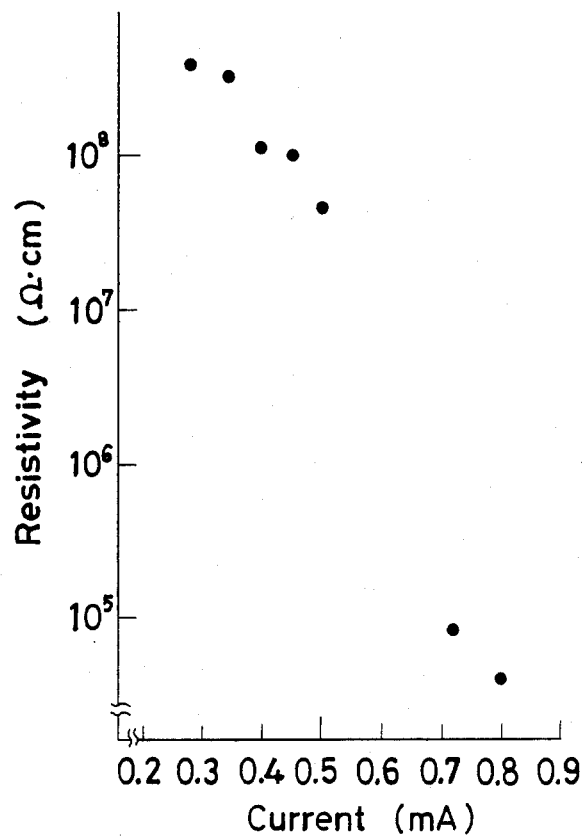
Fig_6

Fig_7
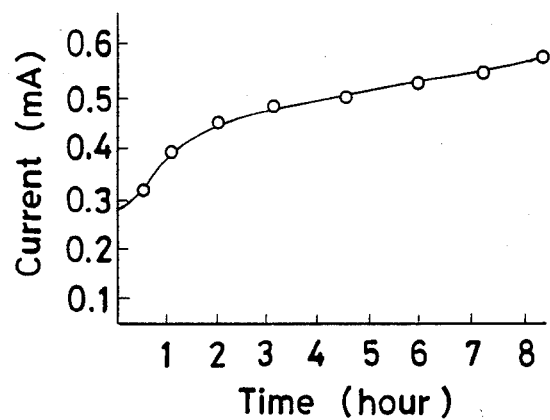
Fig_8
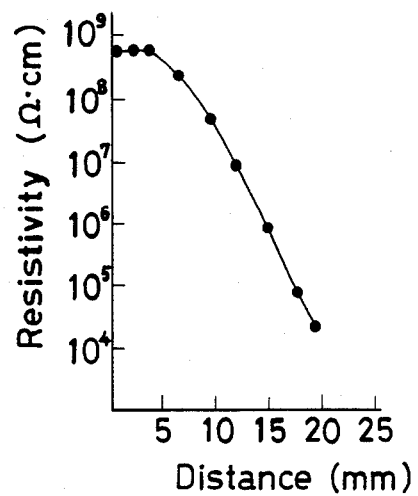

METHOD FOR MANUFACTURE OF III-V COMPOUND SEMICONDUCTING SINGLE CRYSTAL

BACKGROUND OF THE INVENTION

This invention relates to a method for the manufacture of a III-V compound semiconducting single crystal refined to a high degree of purity.

Of the III-V compound semiconducting single crystals, the high-purity single crystal of GaAs constitutes itself a semi-insulator having resistivity of at least $10^6$ $\Omega$.cm. When a device is constructed by using this GaAs crystal as a substrate for an optoelectronic integrated circuit formed of an integration of optical elements and electronic elements, it can decrease the floating capacity due to wire distribution and facilitate the separation between elements and, therefore, add greatly to the density of integration.

As the techniques available for the production of the semi-insulating GaAs, there have been heretofore known the boat growth method, the low-pressure encapsulated pulling method, and the high-pressure encapsulated pulling method. Although the boat growth method can be carried out under atmospheric pressure, it has the disadvantage that silicon from quartz as the material for the boat will pass into the semi-insulating material and lower the resistivity thereof. To compensate for the loss of resistivity, there is generally followed a practice of adding enough chromium to increase the semi-insulating property of the material. This practice, however, entails a possibility that the added chromium will be unevenly distributed and, as the result, the properties will be dispersed or these properties will be altered during the thermal process. The low-pressure encapsulated pulling method uses as the starting material the polycrystalline GaAs produced by the boat growth method. Since this starting material has a low degree of purity, this method necessitates addition of chromium. The high-pressure encapsulated pulling method which does not require any addition of chromium effects formation of the crystal under application of high pressure and, therefore, disadvantageously causes most of the produced crystals to sustain defects due to the influence of a hot atmosphere under pressure. Further, the encapsulant and the high-pressure gas convection have their effects in complicating the procedure of manufacture and impairing the uniformity of resistance distribution in the formed crystals. This method, accordingly, has found it difficult to produce single crystals having resistivity of at least $10^6$ $\Omega$.cm and enjoying uniform resistance distribution with satisfactory repeatability. Possible reasons for this difficulty may be that no method has yet been established for effecting desired refining of GaAs melt and that a method for determining the quality of GaAs melt has not been available.

SUMMARY OF THE INVENTION

An object of this invention is to provide a method for manufacturing a III-V compound semiconducting single crystal having high purity and high resistivity easily with satisfactory repeatability.

The method of the present invention for the manufacture of a single crystal, therefore, uses a procedure which comprises allowing a molten crystalline material melted under high pressure during the course of production of a single crystal by the encapsulated pulling method to be exposed to a pressure lower than the pressure exerted during the pulling of a crystal thereby causing the molten material to send forth bubbles and the departing bubbles to entrain impurities from the molten material, bringing a seed crystal into contact with the molten material, applying a voltage thereto and measuring the magnitude of current flowing thereto, and when the results of this measurement show that the purity of the molten material has reached a prescribed level, pulling the forming crystal, and increasing the ambient pressure to the fixed working pressure thereby encouraging growth of the crystal. As described above, the present invention effects the desired refining of the molten material only by the control of the ambient pressure and, therefore, is very easy to work. Since the growth of the crystal is started after the purity of the molten material has been confirmed through measurement to have reached the prescribed level, the method of the present invention is capable of producing a single crystal of high quality with high repeatability.

The other objects and features of the invention will become apparent to those skilled in the art as the disclosure is made in the following description of a preferred embodiment of the invention, as illustrated in the accompanying drawings.

BRIEF EXPLANATION OF THE DRAWING

FIG. 1 is a sectioned explanatory view of one typical apparatus for the manufacture of a single crystal.

FIG. 2 is a circuit diagram illustrating application of potential to the apparatus of FIG. 1.

FIG. 3(A) is an equivalent circuit of the circuit diagram of FIG. 2.

FIG. 3(B) is a graph illustrating the magnitude of current displayed on the ammeter in the circuit diagram of FIG. 2.

FIG. 4 is a graph showing the relation between the duration of treatment for refining the molten GaAs and the magnitude of current.

FIG. 5 is a graph showing the relation between the duration of treatment for the growth of GaAs crystal and the magnitude of current.

FIG. 6 is a graph showing the relation between the magnitude of current of the molten GaAs and that of the resistivity of the produced crystal.

FIG. 7 is a graph showing the relation between the period of formation of a single crystal of GaAs and the magnitude of current.

FIG. 8 is a graph illustrating the distribution of resistance in the produced single crystal of GaAs.

DESCRIPTION OF PREFERRED EMBODIMENTS

FIG. 1 represents a typical apparatus for the manufacture of a single crystal by the encapsulated pulling method. In this diagram, 1 denotes a high-pressure container. This high-pressure container 1 is provided therein with a crucible 3 made of quartz or pyrolitic boron nitride, for example. The crucible 3 is held in position by a supporting member 4 made of carbon material, for example, and supported rotatably by a supporting shaft 9. The crucible 3 is provided on the periphery thereof with a heater 2, which serves to heat and keep the crucible at a prescribed temperature. On the crucible 3, there is disposed an electroconductive pulling shaft 5 which is provided at the leading end thereof with a seed crystal 6. This pulling shaft 5 is adapted so as to be rotated about its axis and moved upwardly and downwardly.

In the apparatus constructed as described above, the crucible 3 is charged with prescribed amounts of Group III and Group V elements to compose a desired III–V compound. Then as an encapsulant for the charged elements, boron oxide ($B_2O_3$) is added thereto in an amount such that, when melted, this compound forms a layer not less than 10 mm in thickness. Examples of III–V compounds include GaAs, InP, GaP, and GaSb. A combination of elements required to compose a desired III–V compound is used as the starting material.

After the crucible 3 has been charged with a prescribed amount of the starting material, it is placed inside the high-pressure container 1, enveloped with an inert gas such as argon or nitrogen which is compressed to a high pressure on the order of at least 40 to 50 atmospheres, and then heated at a temperature exceeding the melting point of the starting material for the crystal. Consequently, a molten mass of the material for the crystal forms a layer 7 at the bottom of the crucible and a molten mass of $B_2O_3$ forms a layer 8 in the upper portion of the crucible. The layer of molten $B_2O_3$ serves as an encapsulant to prevent the molten mass of the material for the crystal from being vaporized out.

Generally after the material for the crystal has been thoroughly melted within the crucible, the seed crystal 6 is brought into contact with the molten mass 7 of the material for the crystal and then lifted at a prescribed speed to promote the growth of crystal of the III–V compound. At this time, the inner pressure of the container is desired to fall in the range of 3 to 30 atmospheres. If the inner pressure falls below the lower limit (3 atmospheres), the molten mass of the material is liable to produce a polycrystal or twin crystal and lower the yield of commercially valuable single crystal. If the inner pressure exceeds 30 atmospheres, the molten mass tends to undergo heavy dislocation and uneven intracrystalline distribution, although the yield of single crystal may be improved.

In accordance with the present invention, after the material in the crucible 3 has been thoroughly melted and the layer of molten mass of the material for the crystal 7 and the layer of molten encapsulant 8 have been consequently formed, the inner pressure of the high-pressure container is lowered to a level lower than the pressure exerted during the pulling of the seed crystal. When the inner pressure of the container is lowered as described above, part of the elements used as the material for the crystal or the entrained inert gas gives rise to numerous bubbles in the interface between the two molten masses. These bubbles rise up through the layer of molten $B_2O_3$ and scatter and pass into the inert gas now kept under lowered pressure. Since the impurities present in the molten mass of the material for the crystal are removed as embraced in or entrained by these departing bubbles, the impurity concentration in the molten mass is lowered to effect desired refining of the crystal. The formation of bubbles mentioned above diminishes with elapse of time. Within 10 to 30 minutes of lowering the inner pressure of the container, the molten mass of the material for the crystal assumes a stable state in which bubbles occur steadily in a limited amount. At this time, the molten mass is tested for its quality (purity). When the quality is found by the test to have reached the prescribed level, the inner pressure of the high-pressure container is increased to the order of 3 to 30 atmospheres so as to suppress the formation of bubbles in the molten mass. Then, the seed crystal is brought into contact with the molten mass and pulled to promote the growth of the single crystal.

As a measure for lowering the inner pressure of the high-pressure container for the purpose of the aforementioned formation of bubbles, there may be adopted a method involving abrupt decrease of high pressure, a method involving gradual decrease of pressure over a long span of time, a method involving stepwise decrease of pressure, or a method involving several alternating cycles of decrease and increase of pressure. If the inner pressure is lowered too abruptly from high to low pressure, the formation of bubbles proceeds vigorously and the molten mass of the material for the crystal becomes violently agitated to enhance the removal of impurities and shorten the time required for the treatment. There nevertheless ensues a problem that the elements of Group III and Group V will readily be scattered about in their simple form and the ratio of the III–V elements will be varied. In the case of the method which involves several alternating cycles of increase and decrease of pressure, the otherwise possible defilement of the produced crystal with impurities can be curbed because the inert gas which serves as the source for the inner pressure is replaced with a new supply each time the increase and decrease of pressure are alternated. The results of studies and experiments so far conducted indicate that generally the impurity concentration in the molten mass is lowered to below half of original level when the inner pressure is lowered below 10 atmospheres and the formation of bubbles is allowed to last for several minutes. The time required for the treatment can be shortened by lowering the inner pressure to negative pressure, i.e. to a vacuum of the order of $1 \times 10^{-2}$ Torrs.

The impurity concentration of the molten mass of the material for the crystal during the course of refining treatment can be determined by connecting lead wires 10, 11 to the supporting member 4 for the crucible 3 and the pulling shaft 5 for the seed crystal and applying an AC voltage from an AC power source 12 to the seed crystal 6 which is held in contact with the molten mass 7 of the material for the crystal (FIG. 2). Since the molten mass 7 of the III–V compound can be regarded as a resistor and the crucible 3 which is an insulator can be regarded as a condenser, the magnitude of current corresponding to the magnitude of resistance offered by the molten mass 7 is displayed on the ammeter 13. The equivalent circuit which exists in this case is illustrated in FIG. 3(A). Let $r_1$ stand for the magnitude of resistance of the molten mass, $\dot{I}_1$ for the component of current due to the combined resistance of the molten mass and the crucible, $\dot{I}_2$ for the component of displacement current due to the molten mass and the crucible, and C for the capacity of the crucible, then the current, $\dot{I}$, which flows to the molten mass relative to the applied voltage $\dot{E}$ can be expressed by the following formula. Consequently, the magnitude of current illustrated in FIG. 3(B) is displayed on the ammeter 13. (Denoted by "j" is an imaginary number.)

$$\dot{I} = \dot{E} / \left( r_1 + \frac{1}{j\omega C} \right)$$

It is evident from the formula given above that while the AC voltage is applied to the molten mass 7 within the crucible, the resistance $r_1$ falls and the current $\dot{I}$ rises with the increasing impurity concentration in the molten mass because the capacity C of the crucible as the condenser and the frequency ω of the power source are both constant. The magnitude of the current $\dot{I}$ decreases in proportion as the impurity concentration in the molten mass is decreased. The current $\dot{I}$ which is detected by the ammeter thus varies in proportion to the impurity concentration of the molten mass. By detecting the magnitude of this current, therefore, the impurity concentration can be determined on the basis of the resistivity even during the formation of the single crystal.

Practically the AC voltage applied to the molten mass is suitable in the range of about 10 to 20 V. Since the current flowing to the molten mass has some dependency upon the pressure, it is necessary that due consideration should be paid to the relation between these two factors.

By applying the AC voltage to the molten mass within the crucible as described above, the impurity concentration in the molten mass can be known from the resultant magnitude of current and the magnitude of resistivity offered when the molten mass produces a single crystal can be easily predicted. The single crystal, therefore, can be obtained with a desired magnitude of resistivity by combining the method for refining the molten mass of the material for the crystal with the method for producing a single crystal by the procedure which subjects the molten mass to the pulling operation after the magnitude of the current flowing to the molten mass has reached the prescribed level.

Now a typical operation of the apparatus for the manufacture of a single crystal in accordance with the present invention will be described below with reference to the graph of FIG. 4. In the apparatus constructed as illustrated in FIG. 1, a crucible made of pyrolytic boron nitride was charged with prescribed amounts of Ga, As, and $B_2O_3$ and set in position within a high-pressure container. The inner pressure of this container was increased to 50 atmospheres by forced introduction of argon gas. The crucible was heated to 1300° C. and held at this temperature until there were formed a layer of molten $B_2O_3$ and a layer of molten GaAs. When these layers were formed, the inner pressure of the container was lowered to 20 atmospheres and the seed crystal was brought into contact with the molten mass of GaAs. When an AC voltage of 15 V was applied to the molten mass, the magnitude of current displayed on the ammeter was 0.62 mA (point "a" in FIG. 4). The magnitude of current fell to 0.4 mA (point "b") when the inner pressure was briefly lowered to 3 atmospheres and again heightened back to 20 atmospheres. The magnitude of current remained constant while the inner pressure was left unchanged for a period of 9 hours and 30 minutes. The magnitude of current fell to 0.31 mA (point "c") when the inner pressure was briefly lowered to 3 atmospheres and heightened back to 20 atmospheres. This fall of the magnitude of current implies that the molten mass of GaAs was further refined by the treatment.

Then, under continued application of voltage, the seed crystal was pulled at a speed of 10 mm/hr consequently to produce a single crystal of GaAs about 50 mm in diameter in about 100 mm in length. The relation between the magnitude current and the length of time lapsed during the work of pulling was as shown in FIG. 5. It is noted from FIG. 5 that the magnitude of current decreased with the advance of the growth of crystal. This relation is presumed to occur because the growing crystal gradually cools and gains proportionally resistivity. From this change in the magnitude of electric current along the course of time, the uniform distribution of resistance in the crystal could be estimated. The resistivity of the single crystal obtained as described above was $4.5 \times 10^8$ Ω.cm. When a wafer was cut from the single crystal and was tested for distribution of resistance in the crystal, virtually no dispersion was found in the uniformity of resistance distribution.

FIG. 6 is a graph showing the relation between the magnitude of current flowing to the molten mass of GaAs and that of resistivity in the single crystal of GaAs produced from the molten mass. By the method described above, the magnitude of resistivity in the single crystal produced from a molten mass, whose magnitude of current immediately before the growth of crystal is 0.725 mA, is calculated to be about $9 \times 10^4$ Ω.cm. When the molten mass has an amperage of 0.5 mA, the single crystal produced from this molten mass is expected to offer about $7 \times 10^7$ Ω.cm of resistivity. A molten mass whose magnitude of current is 0.35 mA is expected to produce a single crystal having at least $10^8$ Ω.cm of resistivity.

A single crystal of GaAs possessed of a desired magnitude of resistivity and refined to a high degree of purity, therefore, can be produced by continuing the treatment of refining by means of decrease of pressure while continuously measuring the magnitude of current flowing to the molten mass of GaAs in the crucible and, if the magnitude of current fails to go down to the prescribed level, briefly increasing the pressure and subsequently decreasing it thereby bringing the treatment of refining to completion and, after the magnitude of current has reached the aforementioned prescribed level, increasing the pressure to a level appropriate for the production of a single crystal of GaAs. The determination of the quality of single crystal by the application of an AC voltage can be conducted at any time freely chosen between the time the molten mass of the material for the crystal is formed and the time the growth of crystal is initiated.

As is clear from the foregoing description, in accordance with this invention, the removal of impurities from the molten mass of the material for the crystal can be effected by controlling the pressure of the atmosphere enveloping the molten mass and the quality of the molten mass can be determined by applying an AC voltage to the molten mass and measuring the magnitude of current flowing thereto. Thus, a III–V compound semiconducting single crystal possessed of a desired magnitude of resistivity can be produced with satisfactory repeatability. This invention, accordingly, will contribute immensely to the growth of the technology of optoelectronic integration.

Now, the present invention will be described more specifically below with reference to examples.

EXAMPLE 1

In an apparatus for the manufacture of a single crystal constructed as shown in FIG. 1, a quartz crucible 100 mm in inside diameter and 100 mm in depth was charged with 500 g of 6N-grade gallium, 600 g of 6N-grade arsenic, and 180 g of boron oxide having a water content of 150 ppm and set in position within a high-pressure container. The high-pressure container was once evacuated of air to a high degree of vacuum and then filled with argon gas to about 50 atmospheres and heated at 1300° C. until there were formed a layer of molten GaAs and a layer of molten $B_2O_3$ in the crucible. The inner pressure of the container was lowered to 1.5 atmospheres to induce evolution of bubbles to effect desired refining of the molten mass of GaAs for 20 minutes. Thereafter, the inner pressure of the container was increased to 3 atmospheres and the seed crystal was brought into contact with the molten mass of GaAs and an AC potential of 15 V was applied. At this point, the magnitude of current was found to be not more than 0.3 mA. So, the seed crystal was pulled at a rate of 5 mm/hr to initiate the growth of a single crystal. The relation between the magnitude of current and the length of time spent during the work of pulling was as shown in FIG. 7. This diagram shows that the magnitude of current increased with the passage of time. The single crystal of GaAs thus produced was measured for distribution of resistance at room temperature. The results were as shown in FIG. 8, wherein the lateral axis is graduated for the distance of growth from the head portion of the produced crystal. It is noted from FIG. 8 that the magnitude of resistivity was as high as $6 \times 10^8$ $\Omega$.cm during the first growth of crystal to a distance of about 5 mm from its head portion. After this distance of growth, however, the magnitude of resistivity of the crystal began to decrease. The magnitude remained above the level of $10^6$ $\Omega$.cm until the growth of crystal reached a distance of about 15 mm from its head portion. Beyond this distance, the crystal was deprived of its semi-insulating property. This behavior may occur because, although during the initial growth of crystal the treatment of refining is effective in removing impurities practically completely from the molten mass of GaAs, other impurities such as silicon dissolved from the wall of the quartz crucible subsequently pass gradually into the molten mass of GaAs so much as to lower the resistivity of the molten mass.

The conditions of measurement indicated above in the example were fixed so as to determine the correlation between the magnitude of current and the absolute value of impedance indicated in the aforementioned formula. The magnitude of current, when measured in the presence of pure resistance of 10k$\Omega$, was equivalent to 0.52 mA. The standard resistance had absolutely no dependency upon the pressure.

EXAMPLE 2

In an apparatus constructed for the manufacture of a single crystal as illustrated in FIG. 1, 1000 g of a polycrystalline GaAs produced by the horizontal Bridgman method was placed in a crucible of pyrolytic boron nitride 100 mm in inside diameter and 100 mm in depth and 180 g of $B_2O_3$ having a water content of 150 ppm was superposed thereon. The crucible was set in position within a high-pressure container. The high-pressure container was first evacuated of air to a vacuum of $1 \times 10^{-2}$ Torr and then filled with argon gas to 40 atmospheres. The crucible was heated at 1260° C. to melt the polycrystalline GaAs and the $B_2O_3$. After the materials in the crucible had been thoroughly melted, the inner pressure of the container was lowered to 20 atmospheres and the seed crystal was brought into contact with the molten mass of GaAs. When an AC potential of 15 V was applied to the molten mass, the magnitude of current flowing to the molten mass was found to be 0.72 mA. Subsequently, the inner pressure of the high-pressure container was lowered to 5 atmospheres to induce evolution of bubbles from the molten mass of GaAs, with the apparatus left standing as was for 30 minutes. Then, the inner pressure was heightened again to 20 atmospheres and the seed crystal was brought into contact with the molten mass of GaAs and the potential was applied thereto. In this case, the magnitude of current was found to be 0.5 mA. In this state, the seed crystal was pulled at a speed of 5 mm/hr to produce a single crystal of GaAs about 50 mm in diameter and about 100 mm in length. This single crystal, when tested at room temperature, was found to have resistivity of $5.8 \times 10^7$ $\Omega$.cm.

For the purpose of comparison, the molten mass of GaAs which showed a current of 0.72 mA was directly subjected to the treatment for the growth of crystal without undergoing the treatment of refining by means of decrease of pressure. Consequently, there was obtained a single crystal of GaAs having resistivity of about $9 \times 10^4$ $\Omega$.cm.

What is claimed is:

1. A method for the manufacture of a III-V compound semiconducting single crystal by the pulling technique using an encapsulant, which comprises allowing the molten mass of material for said crystal melted in advance under high pressure to be placed under a pressure lower than the pressure to be exerted during the work of pulling said crystal thereby causing said molten mass to generate bubbles, bringing a seed crystal into contact with said molten mass and applying a potential to said molten mass and measuring the magnitude of electric current flowing consequently to said molten mass, and when the results of the measurement indicate that the purity of said molten mass has reached a prescribed level, increasing the pressure enveloping said molten mass to a level appropriate for the work of pulling said molten mass thereby effecting the work for growth of said crystal.

2. A method according to claim 1, wherein said III-V compound is GaAs.

3. A method according to claim 1, wherein said pressure appropriate for the work of pulling said crystal is in the range of 3 to 30 atmospheres.

* * * * *